United States Patent [19]

Lockhart

[11] Patent Number: 4,521,749
[45] Date of Patent: Jun. 4, 1985

[54] SIMULTANEOUS AMPLITUDE AND ANGLE MODULATION USING DETECTION OF COMPLEX ZEROES

[75] Inventor: Gordon B. Lockhart, Leeds, England

[73] Assignee: National Research Development Corporation, London, England

[21] Appl. No.: 420,572

[22] Filed: Sep. 20, 1982

[30] Foreign Application Priority Data

Oct. 1, 1981 [GB] United Kingdom ............... 8129654
Dec. 8, 1981 [GB] United Kingdom ............... 8137002

[51] Int. Cl.³ .................... H03C 1/00; H03C 3/00; H03D 5/00
[52] U.S. Cl. ........................ 332/17; 332/23 R; 332/31 R; 329/50; 329/122; 329/124; 329/135; 329/142; 455/108; 455/337
[58] Field of Search ............... 329/50, 122, 124, 135, 329/142; 332/17, 21, 22, 23 R, 31 R; 455/108, 337; 358/23

[56] References Cited

U.S. PATENT DOCUMENTS

| | | | |
|---|---|---|---|
| 4,199,821 | 4/1980 | Munday | 332/17 X |
| 4,404,532 | 9/1983 | Weltz | 329/135 X |
| 4,466,109 | 8/1984 | Sari | 329/135 X |
| 4,476,577 | 10/1984 | Matzold et al. | 332/17 X |

Primary Examiner—Eugene R. Laroche
Assistant Examiner—D. Mis
Attorney, Agent, or Firm—Cushman, Darby & Cushman

[57] ABSTRACT

Modulation of a carrier signal using both amplitude and angle modulation increases the information capacity of transmission without increasing bandwidth. Complex zeros in an amplitude modulating signal are detected and a conjugation function dependent on the time of occurrence and imaginary root values of the zeros is generated. The conjugation function is inverted or not inverted in accordance with a binary data signal and used to control the frequency of an oscillator whose output is an angle modulated carrier signal which is then amplitude modulated. On reception the amplitude modulating signal is recovered by an envelope detector and the data signal by a phase locked loop.

18 Claims, 11 Drawing Figures

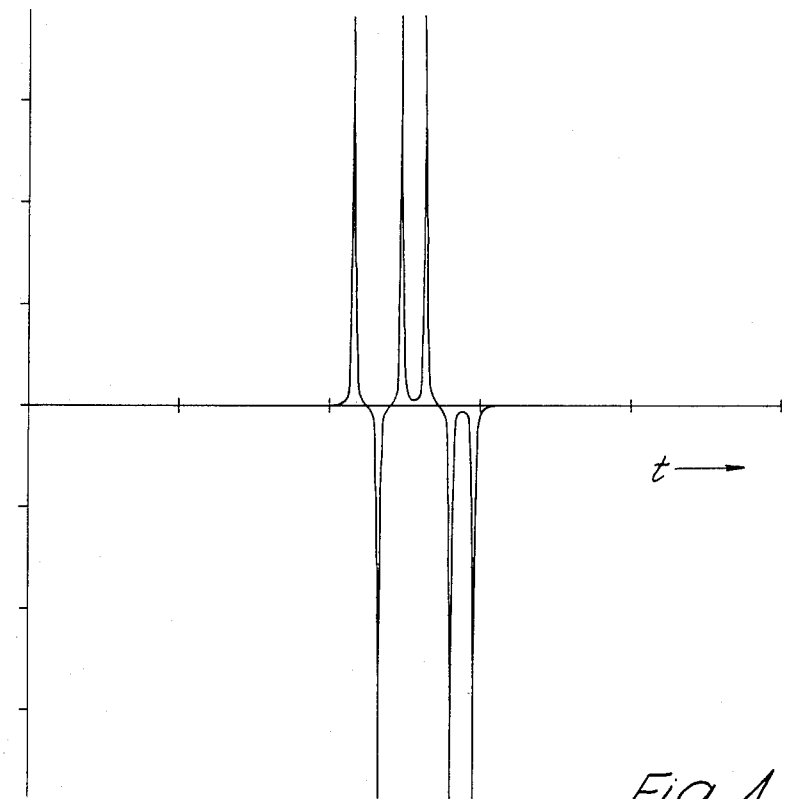

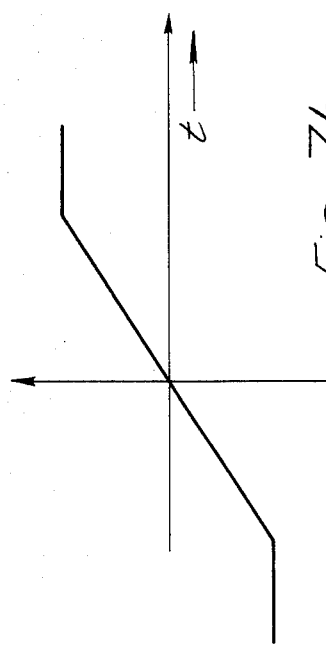
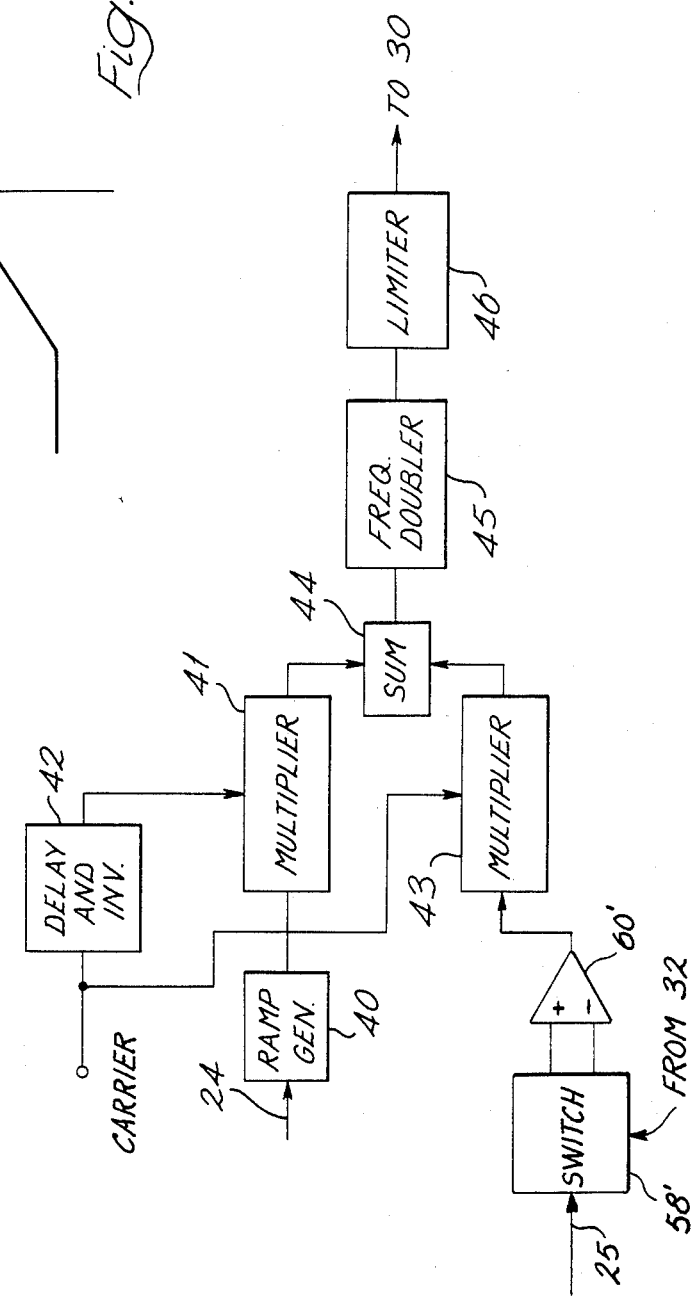

SIMULTANEOUS AMPLITUDE AND ANGLE MODULATION USING DETECTION OF COMPLEX ZEROES

The present invention relates to methods and apparatus for amplitude modulating a carrier signal with a first signal and angle modulating the carrier signal with a second signal. The invention also relates to methods and apparatus for demodulating a carrier signal modulated in this way.

According to a first aspect of the present invention there is provided a method of modulating a carrier signal using both amplitude and angle modulation, comprising the steps of detecting the time of occurrence, and imaginary root value as hereinafter defined, of complex zeros in a first modulating signal, angle modulating the carrier signal for a time on the occurrence of at least some complex zeros, the angle modulation being in accordance with the respective imaginary root values detected for those zeros and in a sense determined by a value of a binary or ternary second modulating signal, and amplitude modulating the angle modulated carrier signal in accordance with the first modulating signal.

Since angle modulation (that is phase or frequency modulation) is carried out when complex zeros occur, the technique is called zero synchronous frequency modulation (ZSFM).

According to a second aspect of the present invention there is provided apparatus for modulating a carrier signal using both amplitude and angle modulation, comprising zero detection means for detecting the time of occurrence, and imaginary root value as hereinafter defined, of complex zeros in the first modulating signal, means for angle modulating a carrier signal for a time on the occurrence of at least some complex zeros, the angle modulation being in accordance with the respective imaginary root values detected for those zeros and in a sense determined by a value of a binary or ternary second modulation signal, and modulating means for amplitude modulating the angle modulated signal in accordance with the first modulating signal.

Preferably for frequency modulation the frequency change imparted to the carrier signal to modulate the carrier signal on occurrence of the $k^{th}$ complex zero approximates to $2\sigma_k/(\sigma_k^2+t^2)$ radians/second, where $\sigma_k$ is the imaginary root value at the complex zero and t represents time, with $t=t_k$ at the time of occurrence of that complex zero. For phase modulation the phase change imparted to the carrier approximate to $$2 \tan^{-1}\left(\frac{t-t_k}{\sigma_k}\right) \text{ radians,}$$

where $t_k$ is the time of occurrence of a complex zero having a root value $\sigma_k$. The sense of the phase or frequency change, as has been mentioned, depends on the second modulating signal.

As will be explained below the main advantage of the present invention is that two modulating signals can be applied to a single carrier but the resulting signal, in practice, has essentially the same bandwidth as would have resulted from the amplitude modulation alone.

The invention may be used to superimpose a data channel on any conventional double sideband amplitude modulated transmission without distorting the envelope or increasing the bandwidth. No modification is required at the transmitter other than provision for carrier phase or frequency modulation. Reception for the data channel may, in many instances, be received by a simple phase or frequency detector such as a phase-locked loop.

Applications include the provision of advisory services (for example monitoring weather information), signalling for regular time checks, and station identification with particular relevance to medium wave broadcasting and mobile ratio.

In this specification the term "imaginary root value" is the imaginary part of a root of an expression obtained by expressing the first modulating signal as a Fourier series, or a polynominal function of time, factorizing and equating the result to zero.

The zero detection means may include a plurality of filters having characteristics related to respective imaginary root values and respective envelope detectors coupled to the filters for generating an output when a real zero occurs. Alternatively the zero detection means may be realised using digital signalling processing techniques.

According to a third aspect of the present invention there is provided a method of demodulating a signal modulated according to the first or second aspects of the present invention when the second modulating signal is a binary signal, comprising the steps of envelope detecting the modulated signal to recover the first modulating signal, and phase or frequency detecting the modulated signal.

According to a fourth aspect of the present invention there is provided apparatus for demodulating a signal modulated according to the first or second aspect of the present invention when the second modulating signal is a binary signal, comprising envelope detection means connected to receive the modulated signal and providing the first signal as its output, and phase or frequency detection means connected to receive the modulated signal for recovering the second modulating signal.

Certain embodiments of the invention will now be described, by way of example, with reference to the accompanying drawings:

FIGS. 1a, 1b and 1c show spectra of modulated signals used in explaining the invention, FIGS. 2a, 2b and 2c are diagrams showing various conjugations of complex zeros in the plane complex value versus time, FIGS. 3a and 3b show a series of zero pairs before and after conjugation for data transmission, FIG. 4 shows a frequency modulating signal for data transmission, FIGS. 5a and 5b are block diagrams of apparatus according to the invention, respectively FIG. 6 is a block diagram of part of a conjugation function generator suitable for use in the arrangement of FIG. 5.

FIG. 7a shows an alternative portion for part of the block diagram of FIG. 5,

FIG. 7b shows the waveform of the ramp generator 40 of FIG. 7a, and

An illustration is first given of three double-sideband amplitude modulated (DSM-AM) signals having the same envelope and bandwidth, but different carrier frequencies.

Consider the DSB-AM signal $$g_1(t) = (1 - k \cos \omega_m t) \cos \omega_o t$$

$k<1$ is the amplitude modulation index, $\omega_m$ a modulating tone and $\omega_o$ the carrier frequency. If frequency modulation (FM) is impressed on the carrier in addition to amplitude modulation (AM) then two other signals may be generated:

$$g_2(t) = (1 - k \cos \omega_m t) \cos (\omega_o t + \theta_2(t))$$

$$g_3(t) = (1 - k \cos \omega_m t) \cos (\omega_o t + \theta_3(t))$$

where $$\theta_{2,3} = \pm 2 \tan^{-1} [-a \sin \omega_m t/(1 - a \cos \omega_m t)] \qquad \text{equation 1}$$

and $$k = 2a/(1 + a^2).$$

Figure 1:
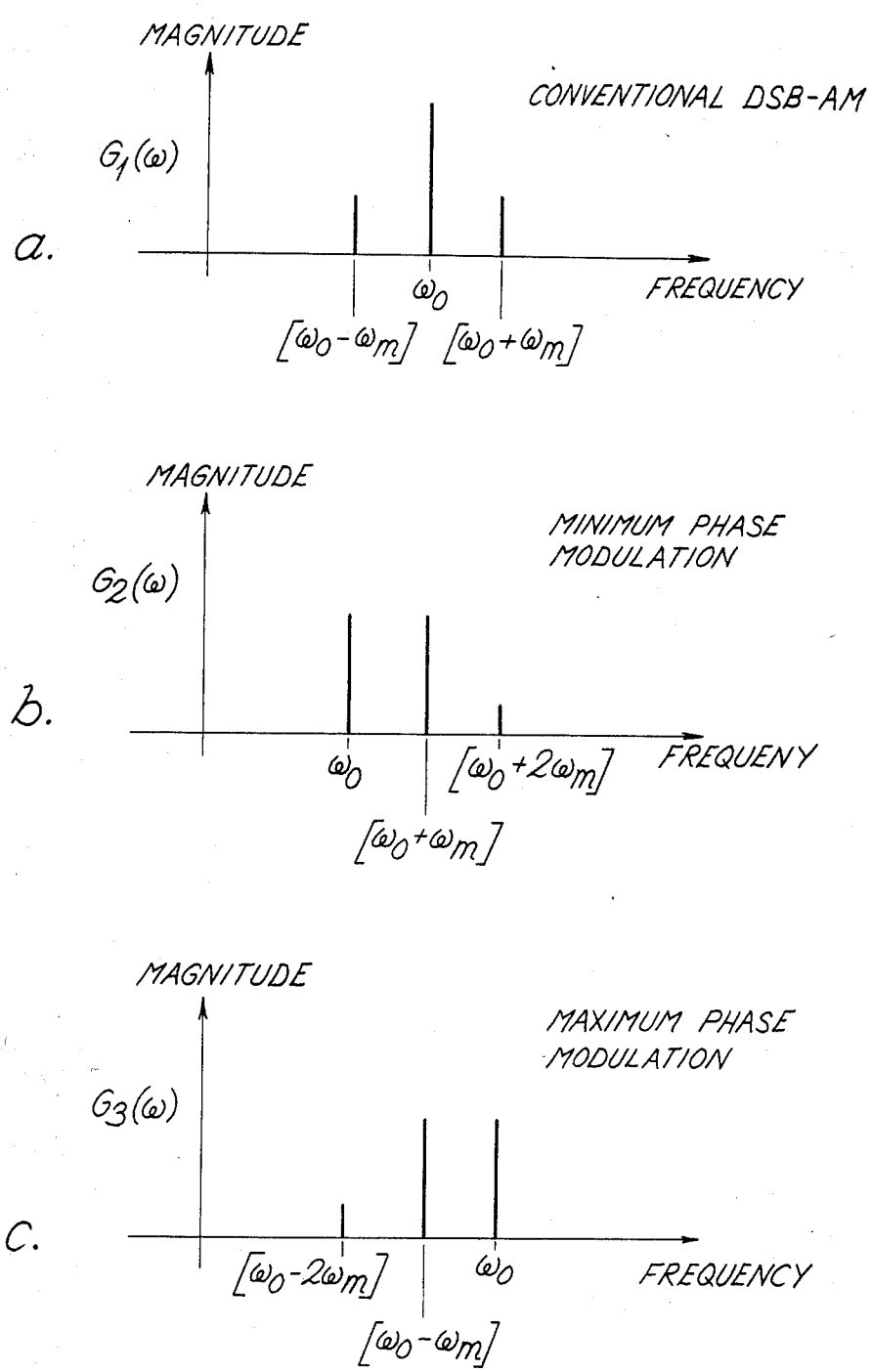

The spectra of signals $g_1(t)$, $g_2(t)$ and $g_3(t)$ are shown in FIGS. 1a, 1b and 1c, respectively, for $k=0.8$. It will be seen that the bandwidths of the three signals are the same and from their equations they have the same envelope. Although a frequency shift is shown in these figures, no such shift occurs in practice for reasons which are given later. Thus, in principle, the redundancy inherent in an envelope detectable signal can be exploited without envelope distortion or an increase in bandwidth.

In general, a real modulated signal $g(t)$ may be expressed in terms of a complex function of time $m(t)$ i.e.

$$g(t) = Re \cdot m(t) e^{j\omega_o t}$$

where Re. indicates "real part of".

Thus $$g(t) = |m(t)| \cos [\omega_o t + \arg m(t)]$$

It is apparent that the envelope and phase function of $g(t)$ identify with $|m(t)|$ and arg $m(t)$ respectively. Also, the spectrum of $g(t)$ is essentially that of $m(t)$ shifted by $\omega_o/2\pi$ Hz. It is therefore a useful simplification in the study of modulation processes to deal with $m(t)$ rather than $g(t)$, as discussed in the papers:

H. B. Voelcker, "Toward a Unified Theory of Modulation—Part I: Phase-envelope Relationships", *Proc. IEEE*, Vol. 54, pp. 340-353, March 1966;—"Toward a Unified Theory of Modulation—Part II: Zero Manipulation", *Proc. IEEE*, Vol. 54, pp. 735-755, May 1966; and G. B. Lockhart, "A Spectral Theory of Hybrid Modulation", *IEEE Trans. Comm.*, COM-21, 7, pp. 790-800, July 1973.

For the periodic signal above $$m_1(t) = 1 - k \cos\omega_m t =$$

$$-\frac{a}{(1+a^2)} e^{-j\omega_m t} + 1 - \frac{a}{(1+a^2)} e^{j\omega_m t} \text{ where } k = \frac{2a}{1+a^2}$$

Figure 2:
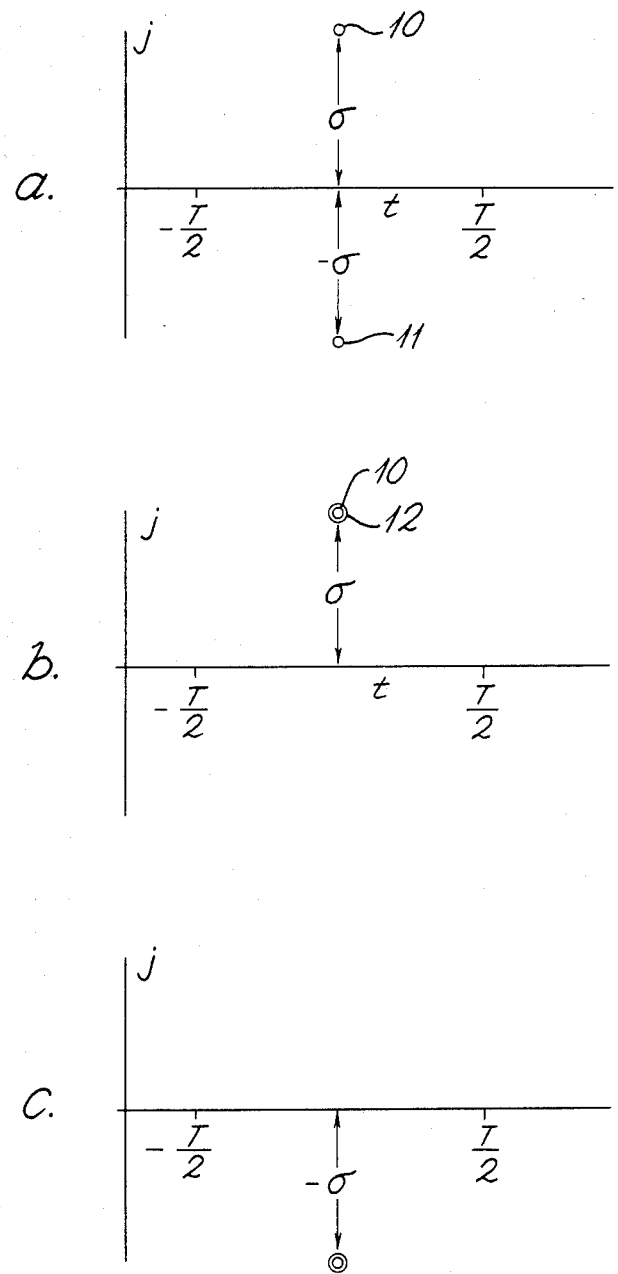

This expression can be factorized $$m_1(t) = \frac{(1 - ae^{j\omega_m t})(1 - ae^{-j\omega_m t})}{(1 + a^2)}; \qquad \text{equation 2}$$

and if a complex time variable x is defined so that $x = t + j\sigma$ then, $$m_1(x) = 0$$

when $x = \pm j(\log_e a)/\omega_m$, i.e. $\sigma = \pm(\log_e a)/\omega_m$. These roots of x are shown by circles 10 and 11 in the plot complex variable versus time of FIG. 2a over one period $\pm T/2$ where $\omega_m = 2\pi/T$. Since, $$|1 - ae^{j\omega_m t}| = |1 - ae^{-j\omega_m t}|$$

substitution of $(1 - ae^{j\omega_m t})$ for $(1 - ae^{-j\omega_m t})$ in equation 2 will have no effect on the envelope $(m_1(t))$ of the modulated signal. This operation is known as "zero conjugation" since it is equivalent to replacing a zero of $m(x)$ by its complex conjugate as shown in FIG. 2b where the zero (or root) 11 is replaced by its complex conjugate 12.

In this case, where modulation is by a single tone, conjugation of two zeros permits three possibilities:

$$m_1(t) = (1 - ae^{j\omega_m t})(1 - ae^{-j\omega_m t})/(1 + a^2) \qquad \text{(a)}$$

$$m_2(t) = (1 - ae^{j\omega_m t})^2/(1 + a^2) \qquad \text{(b)}$$

$$m_3(t) = (1 - ae^{-j\omega_m t})^2/(1 + a^2) \qquad \text{(c)}$$

(Conjugation in the opposite sense from that shown in FIG. 2b corresponds to equation (c) and is shown in FIG. 2c). Such signals constitute a common envelope set (see Voelcker's abovementioned papers). $m_2(t)$ and $m_3(t)$ are termed the minimum and maximum phase members respectively. Expansion of the expressions (a), (b) and (c) above confirms that each signal possesses three spectral components and a total bandwidth of $2\omega_m$. Also, the phase functions of equation 1 may be derived directly from (b) and (c).

A generalisation of the above analysis shows that in a given periodic amplitude modulating signal of bandwidth $N\omega_m$, $3^{N/2}$ distinct members of the common envelope set exist differing in frequency modulating function only. For example, consider the modulating signal, $$(1 - k \cos N\omega_m t)$$

where N is an integer and k is a constant. Some of the zeros of the corresponding DSB-AM signal over one period of $\omega_m$ are illustrated in FIG. 3a. If $N=128$ each of the 64 zero pairs may be conjugated up, down or left unconjugated, as is shown in FIG. 3b for some zeros, giving a total of $3^{N/2}$ possibilities.

The frequency modulating function shown in FIG. 4 conjugates zeros as shown in FIG. 3 and may be interpreted as the 6-bit data signal 101100 shown at 13. Such a signal cannot affect the envelope modulation $(1 - k \cos N\omega_m t)$ and can be received by hard limiting followed by phase or frequency detection.

Each "spike" in FIG. 4 follows the above mentioned function $2\sigma_k/(\sigma_k^2 + t^2)$ which becomes $2\sigma/(\sigma^2 + t^2)$ with $t=0$ at the center of the spike and $\sigma$ corresponding to a respective complex zero. Since the function rapidly tends to zero with increase in the magnitude of t, the "tails" of the spikes are truncated without significant increase in the bandwidth of the modulated signal.

The function $2\sigma/(\sigma^2+t^2)$ arises from the requirement to change frequency by an amount such that no envelope change occurs. Consider a zero of a signal represented by the factor $F=(1-e^{j\Omega(t-j\sigma)})$. Since the fator is zero when $t=0+j\sigma$ this denotes the real time position (0) and imaginary value ($\sigma$) of the zero.

Expanding the exponential term in F, $$F=(1-e^{j\Omega(t-j\sigma)})= -j\Omega(t-j\sigma)-[j\Omega(t-j\sigma)]^2/2! - ..$$

Neglecting second order terms, $F=-j\Omega(t-j\sigma)$.

For conjugation F is multiplied by $F^*/F$ where $F^*$ is the complex conjugate of F. i.e. the conjugation function $F^*/F=|F|/e^{-j\text{ arg }F}/|F|e^{j\text{ arg }F}=e^{-2j\text{ arg }F}$. This represents a phase modulating function having a constant envelope and phase function $\theta(t)=2\text{ arg }F$. It remains to derive an expression for arg F $$F = -j\Omega(t - j\sigma) = -\Omega(+\sigma + jt)$$

$$\therefore \text{arg }F = \left(\tan^{-1}\frac{t}{\sigma}\right) + \pi$$

$$\therefore \theta(t) = 2\tan^{-1}\frac{t}{\sigma}$$

and frequency modulating function =

$$\theta'(t) = \frac{d}{dt}\left(2\tan^{-1}\frac{t}{\sigma}\right) = 2\sigma/(\sigma^2 + t^2)$$

Thus it is necessary that this function, or an approximation thereto be used.

In general, given an amplitude modulating signal in real time (for example speech or music), although zeros will also occur in conjugate pairs they will appear irregularly in complex time so that the value of t must be determined for every zero to be conjugated. Thus before zero-synchronous modulation can be imposed it is necessary to locate the zero positions. For every complex zero found the imaginary root value $\sigma$ is also required because the function required for conjugation depends on $\sigma$. Zero positions and $\sigma$ values can be found by using a bank of linear filters as will be described.

A practical ZSFM system is now described with reference to FIGS. 5a and 5b. A first signal which is to amplitude modulate a carrier signal is applied at a terminal 20 and thence passes to a bank 21 of filters. This signal may for example be an audio signal but it must contain a d.c. component of sufficient size to prevent zero crossings occurring. The outputs of these filters indicate when complex zeros with different imaginary root values occurs in the signal applied to the terminal 20. The filters are described in more detail later but each has a characteristic corresponding to the imaginary root value of the zero it is to detect.

Each filter output is connected to a detector such as the detector 22 which envelope detects the filter output and signifies by means of an internal comparator when the envelope passes through a real zero, thus indicating the presence of a complex zero in the corresponding filter input. The logic circuit 23 coupled to the detectors provides a first output on line 24 indicating that a zero has been detected and a second output on line 25 giving the imaginary root value of the zero. These two outputs are passed to a conjugation function generator 26 which receives a binary data signal forming a signal which is to frequency modulate the carrier signal from a terminal 27.

Figure 5A:
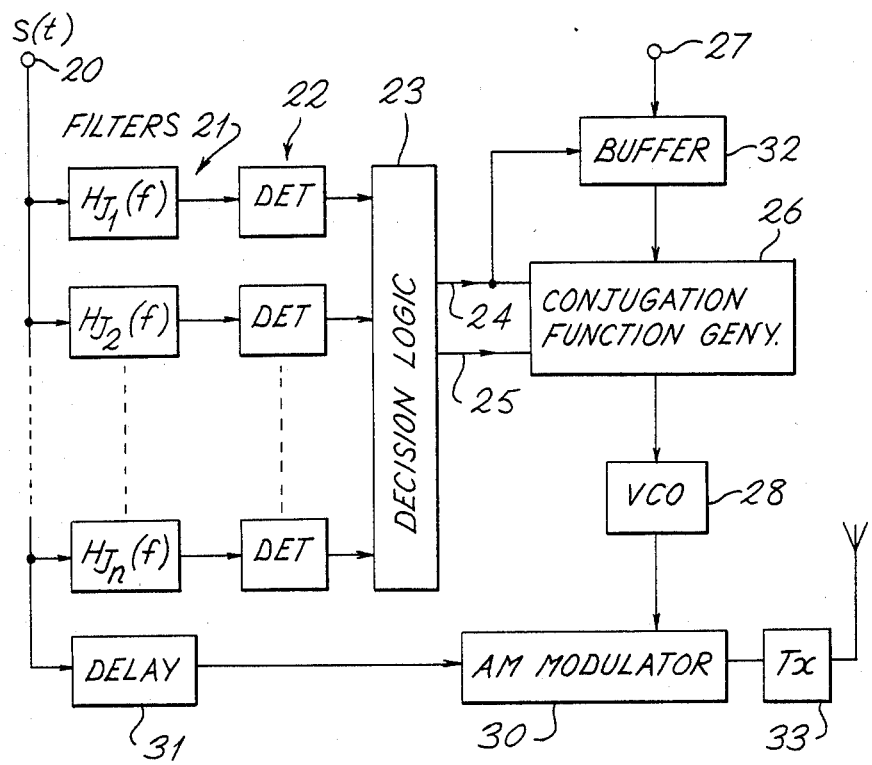
Figure 5B:
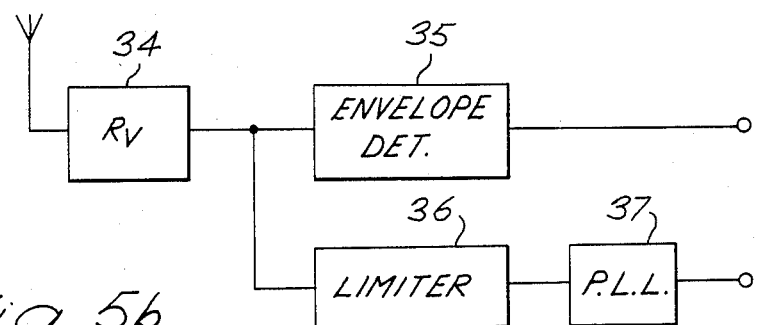

FIG. 5a has the advantage that the value of $\sigma$ is easily adjusted as required by the decision logic 23 by changing the level on the line 25.

Provided the number of zeros conjugated in one sense equals the number conjugated in the other sense then for practical purposes the frequency range occupied by the bandwidth of the modulated signal remains unchanged. The effect of unequal zeros and ones can be considered by generalising equation (a):

$$m_1(t)=(1-a_{-N}Z^{-N})\ldots(1-a_{-1}Z^{-1})(1-a_1Z^1)\ldots(1-a_NZ^N)$$

where $Z=e^{j\omega_m t}$. By inspection it is apparent that the highest and lowest powers of Z above are $Z^N$ and $Z^{-N}$ respectively so that the spectral limits of $m_1(t)$ extend from $-N\omega_m$ to $+N\omega_m$ with the carrier represented by a constant at $f=0$. (The transmitted signal is just this spectrum translated by $\omega_o$ Hz.) Now conjugation in one sense implies replacing a factor $(1-a_jZ^n)$ by $(1-a_{-j}Z^{-n})$ above and this changes the spectral limits to $-(N+1)\omega_m$ to $(N-1)\omega_m$. Conjugation in the other sense replaces a factor $(1-a_{-j}Z^{-n})$ by $(1-a_jZ^n)$ which causes a similar shift but in the positive frequency direction. In general a shift will always occur unless the number of conjugations in each sense is equal. This condition is not difficult to meet since if $m_1(t)$ models a very long signal quite long asymmetrical strings of 1's and 0's can be tolerated provided they balance in the mean. In practice, however, $m_1(t)$ is effectively limited to a time "window", but, if necessary a redundance complementary bit may be sent after each information bit, thus ensuring equal numbers of 1's and 0's, and this results only in a reduction in bit rate by one half.

The function generator 26 provides an output voltage each time a zero is detected and this voltage is a function of the imaginary root value of the zero detected. In addition voltage generated differs from a mean value in a direction which depends upon the binary bit input at the terminal 27.

Figure 6:
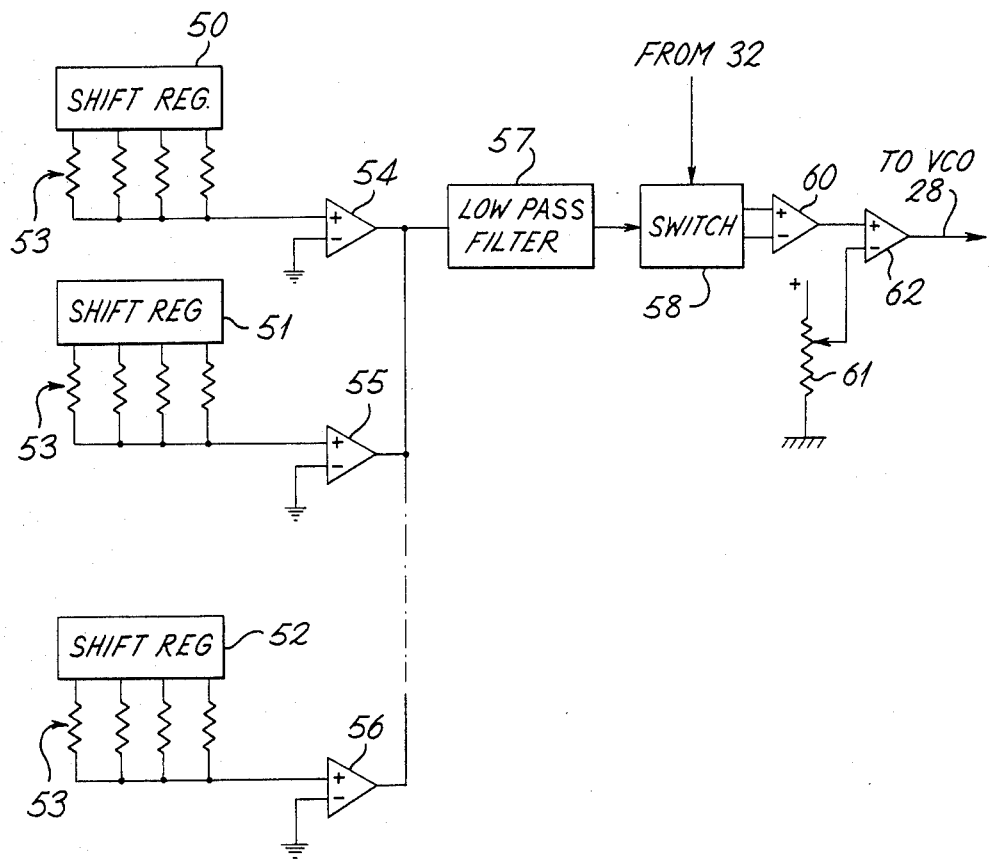

The function generator 26 may comprise a number of shift registers such as the registers 50, 51 and 57 of FIG. 6, one for each imaginary root value which can be detected by the bank of filters 21. Each shift register has taps weighted according to samples of the function $2\sigma/(\sigma^2+t^2)$ evaluated in the region $t=0$; that is each weight corresponds to a value of $2\sigma/(\sigma^2+t^2)$ for the value of $\sigma$ for that shift register and for values of t in the region $t=0$. Weighting may be carried out by connecting resistors 53 of appropriate values to the shift register taps. On detection of a zero, the appropriate shift register is set and then clocked in accordance with increments of t, and a sampled version of the required function is generated by a summing circuit, such as the operational amplifiers 54, 55 and 56, connected by way of weighting resistors to the tap outputs. A low-pass filter 57 is preferably used to smooth the summed outputs.

Alternatively the function generator 26 may include a single weighted shift register; or a number of weighted shift registers, each of which is assocaited with a group of filters in the bank 21. The clock rate applied to, for example, the single shift register is controlled according to the filter which has detected a complex zero, that is according to $\sigma$, since changing the clock rate by integral values is equivalent to changing $\sigma$.

The function generator 26 may in another alternative be based on digital techniques, for example samples of the required function may be stored in a read-only memory and addressed by values of $\sigma$ and t. Digital to analogue conversion at the output of the generator is then required.

In order to take account of the binary data signal the generator 26 may include a circuit which inverts the signal from the low-pass smoothing filter if, for example, the binary value is one. The filter output or its inversion is then added to a bias voltage to form the generator output.

For example in FIG. 6, a double pole electronic switch 58 controlled by the output of the buffer circuit 32 applies the output of the low-pass filter 57 to the inverting or non-inverting input of an operational amplifier 60 in dependence upon the binary value of the data signal and d.c. bias is applied by means of a potentiometer 61 and an operational amplifier 62.

The voltage function from the generator 26 is passed to a voltage controlled oscillator 28 which provides a carrier signal for a modulator 30. The carrier signal is amplitude modulated by the signal from the input terminal 20 passing by way of a delay circuit 31 to the modulator 30.

The delay imparted by the circuit 31 is equal to the time required to detect zeros and change the frequency of the VCO accordingly. A buffer 32 buffers the binary signal applied at the terminal 27 so that each bit is released when one of the filters in the bank 21 detects a zero.

The output of the amplitude modulator is passed to a transmitter 33 for transmission according to known techniques.

In another arrangement where the carrier signal is to be phase modulated, the conjugation generator 26 and the voltage controlled oscillator 28 are replaced by the circuit shown in FIG. 7a. It has already been mentioned that the required phase modulating function is $\theta(t)=2\tan^{-1}(t/\sigma)$ and for a particular complex zero occurring at time $t_k$ this becomes $$\theta(t) = 2\tan^{-1}\left(\frac{t - t_k}{\sigma_k}\right)$$

In FIG. 7a, a ramp generator 40 generates a ramp of the form shown in FIG. 7b where the vertical ordinate represents the constant $t_k$ minus the variable t (i.e. $t - t_k$) each time a complex zero is detected as signalled on the line 24. This ramp signal is multiplied in a multiplier 41 by a signal "$-\sin \omega_o t$" derived from the carrier signal $\cos \omega_o t$ by a delay and inversion circuit 42. A multiplier 43 multiplies the imaginary root value $\sigma_k$ (with sign assigned by the binary data signal) on the line 25 by the carrier signal and the products of the multipliers 41 and 43 are summed by a summing circuit 44. The sign of $\sigma_k$ is assigned by a switch 58' and an operational amplifier 60' in an analogous way to FIG. 6. Thus the output of the summing circuit is:

$$\sigma_k \cos \omega_o t - (t - t_k) \sin \omega_o t \text{ or,}$$

$$\text{Re. } [(\sigma_k + j(t - t_k))e^{j\omega_o t}] \text{ or}$$

$$\sqrt{\sigma_k^2 + (t - t_k)^2} \cos\left[\omega_o t + \tan^{-1}\frac{t - t_k}{\sigma_k}\right]$$

After squaring (for example using an integrated-circuit multiplier) to double the instantaneous frequency and high-pass filtering to remove the low frequency component in a frequency doubler circuit 45, unwanted amplitude modulation resulting from doubling is removed in a limiter circuit 46. The phase of the signal from the limiter circuit 46 is then $$2\tan^{-1}\left(\frac{t - t_k}{\sigma_k}\right)$$

and this signal is ready for application to the amplitude modulator 30 of FIG. 5a.

Signals from the transmitter 33 are received by a receiver 34 (FIG. 5b) and applied to an envelope detector 35 which recovers the first signal applied at the terminal 20. The output of the receiver 34 is also applied to a limiter 36 and then to a phase-locked loop 37 to recover the data signal applied at the terminal 27 as the control signal in the loop, positive and negative excursions from the value existing where there is no frequency modulation indicating the binary values of the data signal.

Each filter in the bank 21 ideally has the response H(f) given by $$H\sigma(f) = e^{2\pi f\sigma}$$

It can be shown that such a filter will always convert a complex zero with imaginary value $\sigma$ to a real zero at the same real time position. For example, the signal $$(1 - k\cos_m t) = \left(-\frac{k}{2}e^{-j\omega_m t} + 1 - \frac{k}{2}e^{j\omega_m t}\right),$$

where $$k = \frac{2a}{1 + a^2},$$

possesses zeros as illustrated in FIG. 2a, i.e. $\sigma = \pm(\log_e a)/\omega_m$. After filtering by H(f), the signal becomes $$m_1(t) = \left(-\frac{k}{2}e^{-j\omega_m t}e^{-\omega_m \sigma} + 1 - \frac{k}{2}e^{j\omega_m t}e^{\omega_m \sigma}\right)$$

now if $\sigma = (\log_e a)/\omega_m$ (i.e. signal zero possesses the same $\sigma$ value which H(f) is designed to detect) on substitution $$m_1(t) = \left(\frac{-1}{1 + a^2}e^{-j\omega_m t} + 1 - \frac{a^2}{1 + a^2}e^{j\omega_m t}\right) =$$

$$0 \text{ for } \omega_m t = 2n\pi, n = 0, \pm 1, \pm 2, \ldots$$

Thus complex zeros are converted to real zeros at the same real time positions.

It should be noted that the filters in the bank 21 are complex due to their non-symmetrical frequency responses. A practical bandlimiting version of these filters may be implemented in a number of ways and three examples are now given.

Firstly, although the impulse responses of the filters are complex, each filter may be realised by two tapped delay lines having weights representing real and imaginary parts respectively of the sampled impulse response, the weights being obtained from the inverse Fourier transform of the filter characteristic which is equivalent to the sampled impulse response. Each delay line is connected to a respective summing circuit and a logic circuit (forming one of the detectors) is provided to indicate when both summing circuits have zero weighted sums, indicating a complex zero.

Secondly, each filter includes an amplitude modulator having an applied carrier frequency such that the input spectrum becomes symmetrically positioned with respect to the carrier frequency. A real filter with a double sided frequency response and having the required characteristic relative to the translated spectrum of the input is used to filter the modulated signal. An envelope detector is connected to the filter output and when a comparator at the detector output is zero, a complex zero is indicated.

Thirdly, the input signal is sampled and quantised and passed to a computer or if necessary one computer for each filter. The quantised input signal is processed, in blocks, by a fast Fourier transform routine and the resulting Fourier coefficients are digitally weighted by the respective filter frequency responses (that is by values of $e^{2\pi f \sigma}$) and inverse Fourier transformed to generate filtered time samples. A complex zero is detected if the computer or one of the computers indicates that the real and imaginary parts of a sample are simultaneously zero.

Values of $\sigma$ corresponding to potential complex zeros have to be selected in specifying the filter bank but only medium values, for example between about $10^{-5}$ and $10^{-3}$, are thought to be of practical use for the following reason. At one extreme the FM function $2\sigma/(\sigma^2+t^2)$ becomes essentially constant if is very large (low modulation depth) and therefore will be undetectable by the receiver frequency detector. At the other extreme as approaches zero (high modulation depth), zero conjugation has little effect since the zero pair cannot be distinguished from a second order real zero ($\sigma=0$). Also, in these circumstances the envelope itself will be near zero so that accurate measurement of phase or frequncy fluctuations becomes increasingly difficult due to noise. In practice therefore only "medium" values are useful and, based on modulation depths and audio frequencies typical for AM broadcasting, could range from about $10^{-5}$ to $10^{-3}$.

Each filter in the bank 21 in practice corresponds to a small range of $\sigma$ values, due to filter imperfections, and if these ranges cover all the $\sigma$ values of interest only a few filters, or even only one filter, are required.

Although a specific embodiment of the invention has been described it will be realised that there are many other ways of putting the invention into practice. For example the bank of filters 21 may be replaced by a data processing system for detecting complex zeros.

Figure 8:
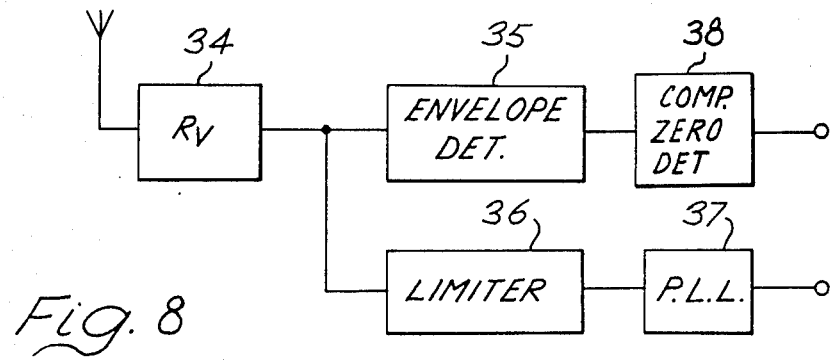
FIG. 8 is a block diagram of a receiver and detector for ternary angle modulated signals.

The data signal may be ternary since, in angle modulation, each complex zero can be conjugated up or down or may be left unaltered. A receiver for such a system (see FIG. 8) should include, in addition to an envelope detector 34 and a PLL 37 (as in FIG. 5), means 38 for detecting those complex zeros in the output signal of the envelope detector corresponding to the complex zeros detected during modulation. An arrangement identical to, or similar to, the filters 21 and detectors 22 may be used. Complex zeros have to be detected since in addition to determining when conjugation has occurred by means of deviation in the PLL control signal to recover two of the ternary values, it is also necessary to detect when a complex zero has occurred but not conjugation has taken place to recover the third ternary value.

I claim:

1. A method of modulating a carrier signal using both amplitude and angle modulation, comprising the steps of
   detecting the occurrence, and imaginary root values, of complex zeros in a first modulating signal,
   angle modulating the carrier signal on the occurrence of at least some complex zeros, the magnitude of the angle modulation being a function of the respective imaginary root values detected for those zeros and of a second modulating signal having not more than three possible values, and
   amplitude modulating the angle modulated carrier signal in accordance with the first modulating signal.

2. A method according to claim 1 wherein the carrier signal is amplitude and frequency modulated and the frequency change imparted to the carrier signal to modulate the carrier signal on occurrence of a $k^{th}$ complex zero approximates to $2\sigma_k/(\sigma_k^2+t^2)$ radians/second, where $\sigma_k$ is the imaginary root value at the complex zero and t represents time, with $t=t_k$ at the time of occurrence of the said $k^{th}$ zero.

3. A method according to claim 1 wherein the carrier signal is amplitude and phase modulated and the phase change imparted to the carrier signal to modulate the carrier signal on occurrence of a $k^{th}$ complex zero approximates to $$2 \tan^{-1}\left(\frac{t-t_k}{\sigma_k}\right) \text{ radians,}$$

radians, where $\sigma_k$ is the imaginary root value at the complex zero and t represents time, with $t=t_k$ at the time of occurrence of the said $k^{th}$ complex zero.

4. Apparatus for modulating a carrier signal using both amplitude and angle modulation, comprising
   zero detection means for detecting the occurrence, and the imaginary root values, of complex zeros in the first modulating signal,
   means for angle modulating a carrier signal on the occurrence of at least some complex zeros, the magnitude of the angle modulation being a function of the respective imaginary root values detected for those zeros and of a second modulation signal having not more than three possible values, and
   modulating means for amplitude modulating the angle modulated signal in accordance with the first modulating signal.

5. Apparatus according to claim 4 wherein the carrier signal is amplitude and frequency modulated and the frequency change imparted to the carrier signal to modulate the carrier signal on occurrence of a $k^{th}$ complex zero approximates to $2\sigma_k/(\sigma_k^2+t^2)$ radians/second, where $\sigma_k$ is the imaginary root value at the complex zero and t represents time, with $t=t_k$ at the time of occurrence of the said $k^{th}$ complex zero.

6. Apparatus according to claim 4 wherein the carrier signal is amplitude and phase modulated and the phase change imparted to the carrier signal to modulate the carrier signal on occurrence of a $k^{th}$ complex zero approximates to $$2\tan^{-1}\left(\frac{t-t_k}{\sigma_k}\right) \text{ radians,}$$

radians, where $\sigma_k$ is the imaginary root value at the complex zero and t represents time, with $t=t_k$ at the time of occurrence of the said $k^{th}$ complex zero.

7. Apparatus according to claim 5 or 6 wherein the zero detection means comprises a plurality of filters, each of the filters having a transfer function $e^{2\pi f \sigma_k}$ with different values of k for each filter and an output with real and imaginary parts, and respective means for each filter for indicating when both the real and imaginary parts of the output of that filter are zero.

8. Apparatus according to claim 5 wherein the means for angle modulating comprises a number of shift registers, one for each of k imaginary root values, $\sigma_k$, which can be detected by the zero detection means, each shift register having taps weighted according to samples of the function $2\sigma_k/(\sigma_k^2+t^2)$ evaluated in the region around $t=0$ for the value of k corresponding to that shift register; means for summing the outputs from the shift register taps; means for inverting or not inverting the summed output in accordance with the binary value of the second modulating signal which is to be represented; and means for generating a carrier signal; frequency modulated in accordance with the output of the inverting means.

9. Apparatus according to claim 5 wherein the means for angle modulating comprises at least one shift register having taps weighted according to samples of the function $2\sigma/(\sigma^2+t^2)$ evaluated in the region around $t=0$ for a respective one of the imaginary values, $\sigma$, which can be detected by the zero detection means; means for clocking the shift register when an imaginary root value is detected at a rate dependent on the imaginary root value detected; means for summing the outputs from the shift register taps; means for inverting or not inverting the summed output in accordance with a binary value of the second modulating signal which is to be represented; and means for generating a carrier signal, frequency modulated in accordance with the output of the inverting means.

10. Apparatus according to claim 6, wherein the means for angle modulating comprises
means for generating a ramp signal having a value $t-t_k$ as t varies when a complex zero is detected,
a first multiplier circuit for multiplying the ramp signal by an inverted version of the carrier signal delayed by 90°,
a second multiplier circuit for multiplying the imaginary root value of the currently detected complex zero by the carrier signal,
signal processing means for summing the outputs of the multiplier circuits, doubling the frequency of the resultant signal and removing amplitude modulation, and
means for inverting or not inverting the signal to the second multiplier circuit in accordance with a binary value of the second modulating signal which is to be represented.

11. A method of demodulating a signal modulated by a method according to claim 1, wherein the second modulating signal is a binary signal, comprising the steps of
envelope detecting the modulated signal to recover the first modulating signal, and
phase or frequency detecting the modulated signal to recover the second modulating signal.

12. A method of demodulating a signal modulated by a method according to claim 1 wherein the second modulating signal is a ternary signal, comprising the steps of
envelope detecting the modulated signal to recover the first modulating signal,
detecting complex zeros in the recovered first modulating signal, and
determing the presence of phase or frequency modulation in the modulated signal, and the sense of any such modulation when a complex zero is detected to recover the second modulating signal.

13. Apparatus for demodulating a signal modulated by an apparatus according to claim 4 when the second modulating signal is a binary signal, comprising
envelope detection means connected to receive the modulated signal and providing the first signal as its output, and
phase or frequency detection means connected to receive the modulated signal for recovering the second modulating signal.

14. Apparatus for demodulating a signal modulated by an apparatus according to claim 4 when the second modulating signal is a ternary signal, comprising
envelope detection means connected to receive the modulated signal and providing the first signal as its output,
means for detecting complex zeros in the output signal of the envelope detection means, and
phase or frequency detection means connected to receive the modulated signal for determining the presence of frequency or phase modulation when a complex zero is detected, and the sense of any such modulation to recover the second modulating signal.

15. A method of transmitting an amplitude modulated first signal and a binary second signal, comprising the steps of
detecting the occurrence, and the imaginary root values, of complex zerios in the first signal,
angle modulating the carrier signal on the occurrence of at least some complex zeros, the magnitude of the angle modulation being a function of the respective imaginary root values detected for those zeros and of the second signal,
amplitude modulating the angle modulated carrier signal in accordance with the first signal,
transmitting the amplitude modulated angle modulated carrier signal from a first location,
receiving the transmitted signal at a second location,
envelope detecting the received signal to recover the first signal, and
phase or frequency detecting the received signal to recover the second signal.

16. A method of transmitting an amplitude modulated first signal and a ternary second signal, comprising the steps of detecting the occurrence, and the imaginary root values, of complex zeros in the first signal, angle modulating the carrier signal on the occurrence of at least some complex zeros, the magnitude of the angle modulation being a function of the respective imaginary root values detected for those zeros and of the second signal, amplitude modulating the angle modulated carrier signal in accordance with the first signal, transmitting the amplitude modulated angle modulated carrier signal from a first location, receiving the transmitted signal at a second location, envelope detecting the received signal to recover the first signal, detecting complex zeros in the recovered first signal, and determining the presence of phase or frequency modulation in the modulated signal, and the sense of any such modulation, when a complex zero is detected, to recover the second modulating signal.

17. Apparatus for transmitting the amplitude first signal and a binary second signal, comprising zero detection means for detecting the occurrence and the imaginary values of complex zeros in the first signal, means for angle modulating a carrier signal on the occurrence of at least some complex zeros, the magnitude of the angle modulation being a function of the respective imaginary values detected for those zeros and of the second signal, modulating means for amplitude modulating the angle modulated signal in accordance with the first signal, means for transmitting the amplitude modulated angle modulated signal, means for receiving the transmitted signal, means for envelope detecting the received signal and providing the first signal as its output, and means for phase or frequency detecting the received signal for recovering the second modulated signal.

18. Apparatus for transmitting an amplitude modulated first signal and a ternary second signal, comprising zero detection means for detecting the occurrence and the imaginary values of complex zeros in the first signal, means for angle modulating a carrier signal on the occurrence of at least some complex zeros, the magnitude of the angle modulation being a function of the respective imaginary values detected for those zeros and of the second signal, modulating means for amplitude modulating the angle modulated signal in accordance with the first signal, means for transmitting the amplitude modulated angle modulated signal, means for receiving the transmitted signal, means for envelope detecting the received signal and providing the first signal as its output, means for detecting complex zeros in the output signal of the envelope protection means, and phase or frequency detection means for determining the presence of frequency of phase modulation in the received signal when a complex zero is detected, and the sense of any such modulation in order to recover the second signal.

* * * * *